United States Patent
Miyachi et al.

(10) Patent No.: US 9,041,457 B2
(45) Date of Patent: May 26, 2015

(54) ELECTRONIC APPARATUS HAVING A DIODE CONNECTED TO A CONTROL TERMINAL OF A SWITCHING ELEMENT

(71) Applicant: DENSO CORPORATION, Kariya, Aichi-pref. (JP)

(72) Inventors: Jyunji Miyachi, Anjo (JP); Tsuneo Maebara, Nagoya (JP); Kazunori Watanabe, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/159,636

(22) Filed: Jan. 21, 2014

(65) Prior Publication Data

US 2014/0203848 A1    Jul. 24, 2014

(30) Foreign Application Priority Data

Jan. 22, 2013   (JP) .................................. 2013-9248

(51) Int. Cl.
  *H03K 17/74*   (2006.01)
  *H03K 17/10*   (2006.01)

(52) U.S. Cl.
  CPC ............. *H03K 17/107* (2013.01); *H03K 17/74* (2013.01)

(58) Field of Classification Search
  CPC .................................................... H03K 17/74
  USPC ......... 327/109, 108, 111, 112, 403, 404, 427, 327/434; 323/266, 269, 271, 272, 277, 311
  See application file for complete search history.

(56) References Cited

U.S. PATENT DOCUMENTS

| 6,316,956 B1 * | 11/2001 | Oglesbee ........................ 326/10 |
| 8,138,818 B2 | 3/2012 | Tsunoda et al. |
| 8,610,485 B2 * | 12/2013 | Hiyama ........................ 327/324 |

FOREIGN PATENT DOCUMENTS

| JP | 2008-99359 | 4/2008 |
| JP | 2009-11049 | 1/2009 |
| JP | 2012-157222 | 8/2012 |

OTHER PUBLICATIONS

Office Action (2 pgs.) dated Jan. 6, 2015 issued in corresponding Japanese Application No. 2013-009248 with an at least partial English-language translation thereof (1 pg.).

* cited by examiner

*Primary Examiner* — Jung Kim
(74) *Attorney, Agent, or Firm* — Nixon & Vanderhye PC

(57) ABSTRACT

An electronic apparatus includes a switching element which has a control terminal and is driven by controlling voltage of the control terminal, a driving power supply circuit which supplies voltage required for driving the switching element, an on-driving circuit which is connected to the driving power supply circuit and the control terminal of the switching element and is supplied with voltage from the driving power supply circuit, and which applies a constant current to the control terminal of the switching element to charge the control terminal, thereby turning on the switching element, and at least one diode which is connected between the on-driving circuit and the control terminal of the switching element. The on-driving circuit applies a constant current to the control terminal of the switching element through the diode.

2 Claims, 5 Drawing Sheets

ELECTRONIC APPARATUS HAVING A DIODE CONNECTED TO A CONTROL TERMINAL OF A SWITCHING ELEMENT

CROSS-REFERENCE TO RELATED APPLICATION

This application is based on and claims the benefit of priority from earlier Japanese Patent Application No. 2013-9248 filed Jan. 22, 2013, the description of which is incorporated herein by reference.

BACKGROUND

1. Technical Field

The present invention relates to an electronic apparatus which includes switching elements driven by controlling the voltage of control terminals, and an on-driving circuit which applies a constant current to the control terminal of the switching element to charge the control terminal of the switching element, thereby turning on the switching element.

2. Related Art

For example, a gate driving apparatus is disclosed in JP-A-2009-011049. The gate driving apparatus is an electronic apparatus which includes switching elements driven by controlling voltage of control terminals, and an on-driving circuit which applies a constant current to the control terminal of the switching element to charge the control terminal of the switching element, thereby turning on the switching element.

The gate driving apparatus drives an IGBT (insulated gate bipolar transistor). The IGBT is a switching element driven by controlling the voltage of the gate. The gate driving apparatus includes an on-constant current pulse gate driving circuit. The on-constant current pulse gate driving circuit is connected to a control source and a gate of the IGBT. The on-constant current pulse gate driving circuit is supplied with voltage from the control source, and applies a constant current to the gate of the IGBT to charge the gate of the IGBT, thereby turning on the IGBT.

If an IGBT having a large current capacity is required, a plurality of IGBTs having a small current capacity (hereinafter, referred to as "small current capacity IGBT") may be connected in parallel. In particular, collectors of the plurality of small current capacity IGBTs are commonly connected, and emitters thereof are commonly connected. To drive the IGBT having a large current capacity configured by connecting the plurality of small current capacity IGBTs in parallel, by the gate driving apparatus, the on-constant current pulse gate driving circuit is connected to the gates of the plurality of small current capacity IGBTs.

Meanwhile, a capacitive component exists between the gate and the emitter of the small current capacity IGBT. In addition, an inductance component exists in lines connecting the plurality of small current capacity IGBTs in parallel. Hence, an LC resonance circuit is formed of a closed circuit in which a current flows through the gate and the emitter of one of the small current capacity IGBTs and into the emitter and the gate of the other of the small current capacity IGBTs. As a result, resonance occurs. Conventionally, to suppress this resonance, a resistor is connected between the on-constant current pulse gate driving circuit and the gate of the small current capacity IGBT. Hence, the amount of current flowing through the closed circuit can be suppressed. As a result, the resonance can be suppressed.

However, since the amount of current flowing through the closed circuit is suppressed to suppress the resonance, the value of resistance cannot be smaller. Hence, switching loss increases due to the resistance.

SUMMARY

An embodiment provides an electronic apparatus which can suppress resonance and reduce switching loss due a resistor connected between an on-driving circuit and a control terminal of a switching terminal.

As an aspect of an embodiment, an electronic apparatus is provided which includes: a switching element which has a control terminal and is driven by controlling voltage of the control terminal; a driving power supply circuit which supplies voltage required for driving the switching element; an on-driving circuit which is connected to the driving power supply circuit and the control terminal of the switching element and is supplied with voltage from the driving power supply circuit, and which applies a constant current to the control terminal of the switching element to charge the control terminal, thereby turning on the switching element; and at least one diode which is connected between the on-driving circuit and the control terminal of the switching element. The on-driving circuit applies a constant current to the control terminal of the switching element through the diode.

DETAILED DESCRIPTION OF THE PREFERRED EMBODIMENTS

First Embodiment

With reference to the accompanying drawings, hereinafter is a described embodiment of the present invention. In the embodiment, an electronic apparatus according to the present invention is installed in a vehicle and is applied to a motor control apparatus controlling a vehicle-driving motor.

The motor control apparatus of an embodiment is described with reference to FIG. 1.

Figure 1:
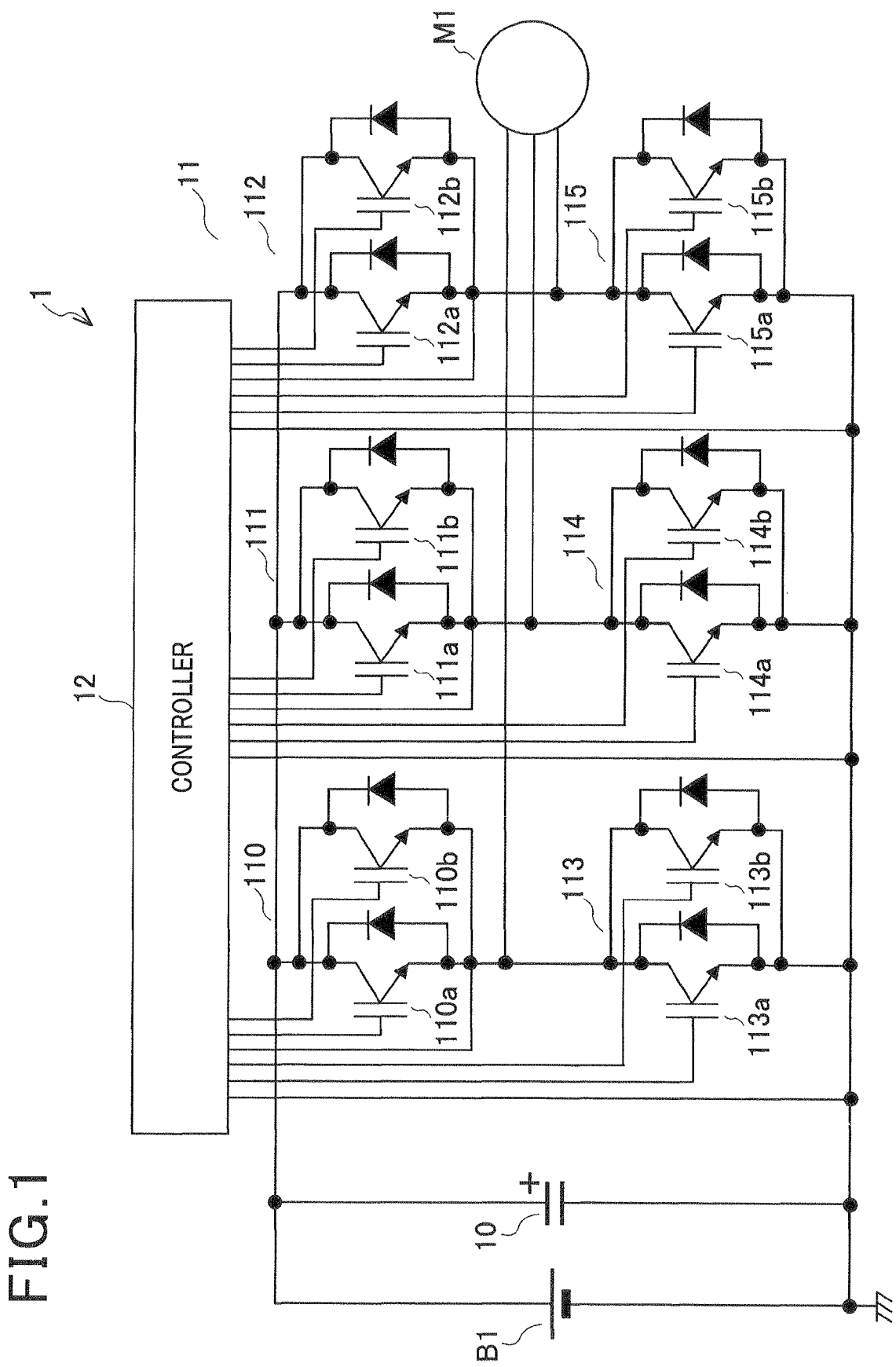
FIG. 1 is a circuit diagram of a motor control apparatus according to an embodiment.

A motor control apparatus 1 (electronic apparatus) shown in FIG. 1 converts DC high voltage outputted from a high voltage battery B1 to three-phase AC voltage, which is provided to a vehicle-driving motor M1, thereby controlling the vehicle-driving motor M1. The motor control apparatus 1 includes a smoothing capacitor 10, an inverter 11, and a controller 12.

The smoothing capacitor 10 is an element for smoothing the DC high voltage of the high voltage battery B1. One end of the smoothing capacitor 10 is connected to a positive terminal of the high voltage battery B1. The other end of the smoothing capacitor 10 is connected to a negative terminal of the high voltage battery B1.

The inverter 11 converts the DC voltage smoothed by the smoothing capacitor 10 to three-phase AC voltage to provide the three-phase AC voltage to the vehicle-driving motor M1. The inverter 11 includes IGBTs 110 to 115 (switching elements).

The IGBTs 110 to 115 are driven by controlling voltage of the gates (control terminals). The IGBTs 110 to 115 are turned on and off to convert the DC voltage smoothed by the smoothing capacitor 10 to three-phase AC voltage.

The IGBT 110 is configured by connecting two IGBTs 110a, 110b having a small current capacity (hereinafter, referred to as "small current capacity IGBT") (small current capacity switching element) in parallel with each other. In particular, the collectors (input terminals) of the two small current capacity IGBTs 110a, 110b are commonly connected, and the emitters (output terminals) of the IGBTs 110a, 110b are commonly connected. The gates, collectors, and emitters of the small current capacity IGBTs 110a, 110b serve as the gate, collector, and emitter of the IGBT 110.

As in the case of the IGBT 110, in the IGBTs 111 to 115, the collectors of small current capacity IGBTs 111a, 111b, the collectors of small current capacity IGBTs 112a, 112b, the collectors of small current capacity IGBTs 113a, 113b, the collectors of small current capacity IGBTs 114a, 114b, and the collectors of small current capacity IGBTs 115a, 115b are commonly connected individually. In addition, the emitters of small current capacity IGBTs 111a, 111b, the emitters of small current capacity IGBTs 112a, 112b, the emitters of small current capacity IGBTs 113a, 113b, the emitters of small current capacity IGBTs 114a, 114b, and the emitters of small current capacity IGBTs 115a, 115b are commonly connected individually. The gates, collectors, and emitters of the small current capacity IGBTs 111a, 111b, the small current capacity IGBTs 112a, 112b, the small current capacity IGBTs 113a, 113b, the small current capacity IGBTs 114a, 114b, and the small current capacity IGBTs 115a, 115b serve as the gates, collectors, and emitters of the IGBTs 111 to 115, respectively.

The IGBTs 110, 113, the IGBTs 111, 114, and the IGBTs 112, 115 are connected in series individually. In particular, the emitters of the IGBTs 110 to 112 are connected to the collectors of the IGBTs 113 to 115, respectively. The series-connected IGBTs 110, 113, the series-connected IGBTs 111, 114, and the series-connected IGBTs 112, 115 are connected in parallel with each other. In particular, the collectors of the IGBTs 110 to 112 are commonly connected. The emitters of the IGBTs 113 to 115 are commonly connected. The collectors of the IGBTs 110 to 112 are connected to one end of the smoothing capacitor 10. The emitters of the IGBTs 113 to 115 are connected to the other end of the smoothing capacitor 10. In addition, the gates and emitters of the IGBTs 110 to 115 are connected to the controller 12. Furthermore, series connection points of the series-connected IGBTs 110, 113, the series-connected IGBTs 111, 114, and the series-connected IGBTs 112, 115 are connected to the vehicle-driving motor M1.

The controller 12 controls the IGBTs 110 to 115. The controller 12 is connected to the gates and the emitters of the IGBTs 110 to 115.

Next, the controller 12 is described in detail with reference to FIG. 2.

Figure 2:
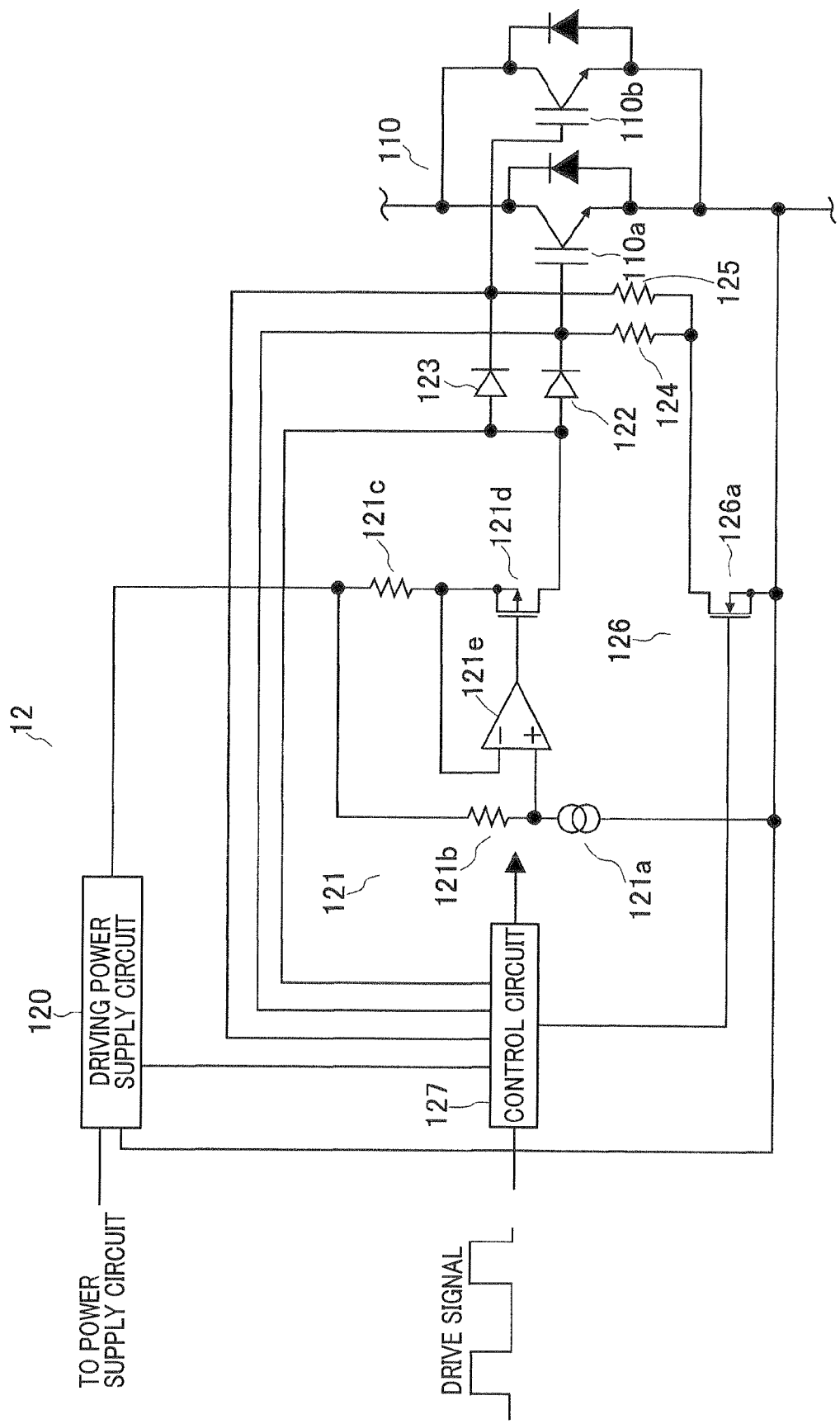
FIG. 2 is a circuit diagram of a controller shown in FIG. 1.

As shown in FIG. 2, the controller 12 includes a driving power supply circuit 120, an on-driving circuit 121, diodes 122, 123, resistors 124, 125, an off-driving circuit 126, and a control circuit 127, which function for the IGBT 110. Similarly, the controller 12 includes driving power supply circuits, on-driving circuits, diodes, resistors, off-driving circuits, and control circuits, which function for the IGBTs 111 to 115.

The driving power supply circuit 120 is controlled by the control circuit 127 and supplies voltage required for driving the IGBT 110 to the on-driving circuit 121. In particular, the driving power supply circuit 120 converts voltage supplied from a power supply circuit (not shown) to predetermined voltage required for driving the IGBT 110, and supplies the predetermined voltage to the on-driving circuit 121. An input terminal of the driving power supply circuit 120 is connected to the power supply circuit. A control terminal of the power supply circuit 120 is connected to the control circuit 127. In addition, a positive electrode terminal is connected to the on-driving circuit 121. A negative electrode terminal is connected to the emitter of the IGBT 110.

The on-driving circuit 121 is controlled by the control circuit 127. The on-driving circuit 121 applies a predetermined constant current to the gate of the IGBT 110 through diodes 122, 123 described later to charge the gate of the IGBT 110, thereby turning on the IGBT 110. In particular, the on-driving circuit 121 makes gate voltage of the small current capacity IGBTs 110a, 110b higher than a threshold voltage, which is used for turning on and off the IGBTs 110a, 110b, to turn on the IGBT 110. The on-driving circuit 121 includes a constant current source 121a, resistors 121b, 121c, a current-controlling FET 121d, and an operational amplifier 121e.

The constant current source 121a regulates the value of current flowing to the IGBT 110. The resistor 121b converts output current of the constant current source 121a to voltage. The resistor 121c converts current flowing to the gate of the IGBT 110 to voltage. The current-controlling FET 121d controls the current flowing to the gate of the IGBT 110. The operational amplifier 121e controls the current-controlling FET 121d based on voltage of the resistors 121b, 121c so that the current flowing to the gate of the IGBT 110 becomes a predetermined constant current regulated by the constant current source 121a.

One end of the resistor 121b is connected to the positive electrode terminal of the driving power supply circuit 120. The other end of the resistor 121b is connected to one end of the constant current source 121a. The other end of the constant current source 121a is connected to the emitter of the IGBT 110. One end of the resistor 121c is connected to the positive electrode terminal of the driving power supply circuit 120. The other end of the resistor 121c is connected to the source of the current-controlling FET 121d. The drain of the current-controlling FET 121d is connected to the diodes 122, 123. A non-inverting input terminal of the operational amplifier 121e is connected to a connection point of the resistor 121b and the constant current source 121a. An inverting input terminal of the operational amplifier 121e is connected to a connection point of the resistor 121c and the current-controlling FET 121d. An output terminal of the operational amplifier 121e is connected to the gate of the current-controlling FET 121d.

The diodes 122, 123 suppress a voltage drop to supply a current from the on-driving circuit 121 to the gate of the IGBT 110 and suppress the flow of current between the small current capacity IGBTs 110a, 110b to prevent resonance. The diodes 122, 123 are integrated with the small current capacity IGBTs 110a, 110b, respectively. In particular, the diodes 122, 123 are adjacent to the small current capacity IGBTs 110a, 110b in the same package in which the small current capacity IGBTs 110a, 110b are installed. The diodes 122, 123 are connected between the on-driving circuit 121 and the gate of the IGBT 110. In particular, the anode of the diode 122 is connected to the drain of the current-controlling FET 121d. The cathode of the diode 122 is connected to the gate of the small current capacity IGBTs 110a. The anode of the diode 123 is connected to the drain of the current-controlling FET 121d. The cathode of the diode 123 is connected to the gate of the small current capacity IGBT 110b. In addition, the anodes and cathodes of the diodes 122, 123 are connected to the control circuit 127.

The resistors 124, 125 limit the flow of current when releasing charge from the gate of the IGBT 110. The resistors 124, 125 are connected between the IGBT 110 and the off-driving circuit 126. In particular, one end of the resistor 124 is connected to the gate of the small current capacity IGBT 110a. The other end of the resistor 124 is connected to the off-driving circuit 126. One end of the resistor 125 is connected to the gate of the small current capacity IGBT 110b. The other end of the resistor 125 is connected to the off-driving circuit 126.

The off-driving circuit 126 is controlled by the control circuit 127 and releases charge from the gate of the IGBT 110 through the resistors 124, 125 to turn off the IGBT 110. In particular, the off-driving circuit 126 makes gate voltage of the small current capacity IGBTs 110a, 110b lower than a threshold voltage, which is used for turning on and off the small current capacity IGBTs 110a, 110b, to turn off the IGBT 110. The off-driving circuit 126 includes an off-driving FET 126a.

The off-driving FET 126a is a switching element for releasing charge from the gate of the IGBT 110. The drain of the off-driving FET 126a is connected to the other ends of the resistors 124, 125. The source of the off-driving FET 126a is connected to the emitter of the IGBT 110. The gate of the off-driving FET 126a is connected to the control circuit 127.

The control circuit 127 controls the driving power supply circuit 120 based on forward voltage of the diodes 122, 123 to regulate output voltage of the driving power supply circuit 120. The control circuit 127 controls the on-driving circuit 121 and the off-driving circuit 126 based on a drive signal inputted from an external device to drive the IGBT 110. In addition, the control circuit 127 determines temperatures of the small current capacity IGBTs 110a, 110b based on the forward voltage of the diodes 122, 123. If determining that the temperature is abnormal, the control circuit 127 stops driving the IGBT 110. The control circuit 127 is connected to the anodes and cathodes of the diodes 122, 123 and the control terminal of the driving power supply circuit 120. In addition, the control circuit 127 is connected to the on-driving circuit 121 and the gate of the off-driving FET 126a.

Next, operation of the motor control apparatus is described with reference to FIG. 1.

When an ignition switch (not shown) of the vehicle is turned on, the motor control apparatus 1 shown in FIG. 1 starts operation. DC high voltage of the high voltage battery B1 is smoothed by the smoothing capacitor 10. The controller 12 controls the IGBTs 110 to 115 forming the inverter 11 based on a drive signal inputted from an external device. In particular, the controller 12 turns on and off the IGBTs 110 to 115 at a predetermined period. The inverter 11 converts the DC high voltage smoothed by the smoothing capacitor 10 to three-phase AC voltage and provides the three-phase AC voltage to the vehicle-driving motor M1. Thereby, the motor control apparatus 1 controls the vehicle-driving motor M1.

Next, drive of the IGBT is described with reference to FIG. 2.

As shown in FIG. 2, the control circuit 127 controls the on-driving circuit 121 and the off-driving FET 126a based on a drive signal inputted from an external device to drive the IGBT 110.

If the drive signal indicates turning on the IGBT 110, that is, the drive signal indicates making a constant current flow from the on-driving circuit 121 to the gate of the IGBT 110 and turning off the off-driving FET 126a, the control circuit 127 operates the on-driving circuit 121 to control the current-controlling FET 121d based on voltage of the resistors 121b, 121c, thereby making a constant current flow to the gates of the small current capacity IGBTs 110a, 110b through the diodes 122, 123 and turning off the off-driving FET 126a. At this time, the control circuit 127 controls the driving power supply circuit 120 based on the forward voltage of the diodes 122, 123, and regulates the output voltage of the driving power supply circuit 120. In particular, when the forward voltage of the diodes 122, 123 is higher than a predetermined voltage, the control circuit 127 increases the output voltage of the driving power supply circuit 120. Conversely, when the forward voltage of the diodes 122, 123 is smaller than the predetermined voltage, the control circuit 127 decreases the output voltage of the driving power supply circuit 120. Hence, a constant current same as the output current of the constant current source 121a flows from the on-driving circuit 121 to the gates of the small current capacity IGBTs 110a, 110b through the diodes 122, 123, thereby charging the gates of the small current capacity IGBTs 110a, 110b. As a result, gate voltages become higher than a threshold voltage, which is used for turning on and off the small current capacity IGBTs 110a, 110b, to turn on the small current capacity IGBTs 110a, 110b, thereby turning on the IGBT 110.

Meanwhile, if the drive signal indicates turning off the IGBT 110, that is, the drive signal indicates stopping the operation of the on-driving circuit 121, and the drive signal indicates turning on the off-driving FET 126a, the control circuit 127 stops the operation of the on-driving circuit 121 to stop the flow of the constant current to the gates of the small current capacity IGBTs 110a, 110b, thereby turning on the off-driving FET 126a. Hence, charge is released from the gates of the small current capacity IGBTs 110a, 110b through the resistors 124, 125. As a result, gate voltages becomes lower than the threshold voltage, which is used for turning on and off the small current capacity IGBTs 110a, 110b, to turn off the small current capacity IGBTs 110a, 110b, thereby turning off the IGBT 110.

In addition, the control circuit 127 finds temperatures of the small current capacity IGBTs 110a, 110b based on the forward voltage of the diodes 122, 123. If determining that the temperature is abnormal, regardless of a state of the drive signal, the control circuit 127 stops the operation of the on-driving circuit 121 and turns on the off-driving FET 126a, thereby stopping the drive of the IGBT 110.

Next, advantages of the motor control apparatus of the embodiment are described.

According to the embodiment, in the IGBT 110, input terminals of the small current capacity IGBTs 110a, 110b are commonly connected, and output terminals of the small current capacity IGBTs 110a, 110b are commonly connected. In the controller 12, the diodes 122, 123 are provided between the on-driving circuit 121 and the gates of the small current capacity IGBTs 110a, 110b. The on-driving circuit 121 makes a constant current flow to the gates of the small current capacity IGBTs 110a, 110b through the diodes 122, 123.

Meanwhile, a capacitive component exists between the gate and the emitter of the small current capacity IGBTs 110a, 110b. In addition, an inductance component exists in lines connecting the small current capacity IGBTs 110a, 110b in parallel. Hence, an LC resonance circuit is formed of a closed circuit in which a current flows through the gate and the emitter of the small current capacity IGBTs 110a and into the emitter and the gate of the small current capacity IGBTs 110b. As a result, resonance occurs. However, the diodes 122, 123 can limit the flow of the current in one direction. Hence, the amount of current flowing through the closed circuit can be suppressed. As a result, the resonance can be suppressed as in the conventional case where a resistor is connected. In addition, when a constant current flows from the on-driving circuit 121 to the gates of the small current capacity IGBTs 110a, 110b, voltage across terminals thereof becomes forward voltage, which is very small. Hence, switching loss can be reduced compared with the case where a resistor is connected.

According to the embodiment, the controller 12 has the resistors 124, 125 between the gates of the small current capacity IGBTs 110a, 110b and the off-driving circuit 126. The off-driving circuit 126 release charge from the gates of the small current capacity IGBTs 110a, 110b through the resistors 124, 125. Hence, the IGBT 110 can be reliably turned off.

According to the embodiment, the diodes 122, 123 are integrated with the small current capacity IGBTs 110a, 110b, respectively. Hence, temperatures of the small current capacity IGBTs 110a, 110b can be found based on the forward voltage of the diodes 122, 123.

According to the embodiment, the control circuit 127 is connected to the diodes 122, 123, and controls the driving power supply circuit 120 based on the forward voltage of the diodes 122, 123 to regulate output voltage of the driving power supply circuit 120. Hence, a predetermined voltage can be supplied to the on-driving circuit 121 without being affected by the forward voltage of the diodes 122, 123. Hence, a predetermined constant current can reliably flow to the gates of the small current capacity IGBTs 110a, 110b.

Figure 3:
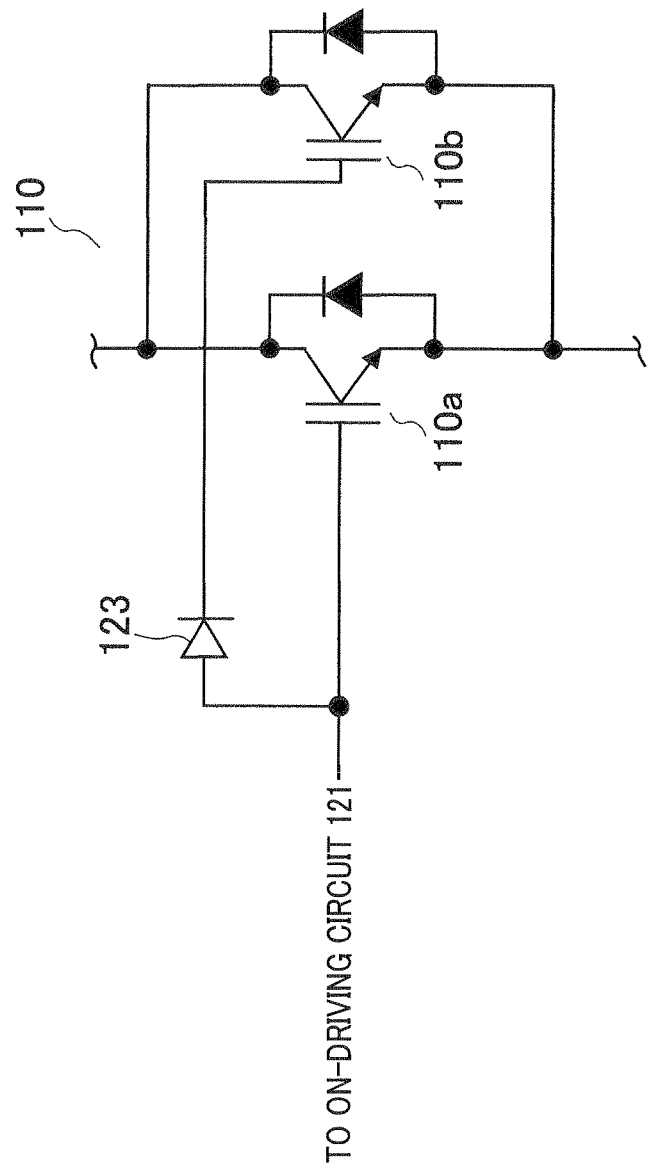
FIG. 3 is a circuit diagram of the periphery of an IGBT according to a first modification of the embodiment.

Note that, in the embodiment, the diodes 122, 123 are connected between the on-driving circuit 121 and the gates of the small current capacity IGBTs 110a, 110b. However, other configurations can be employed. As shown in FIG. 3, the diode 123 may be connected only between the on-driving circuit 121 and the small current capacity IGBT 110b. Even in this case, the flow of the current can be limited in one direction by the diode 123. Hence, the amount of current flowing through the closed circuit can be suppressed. Hence, the number of diodes can be decreased, while suppressing resonance as in the case of the embodiment.

Figure 4:
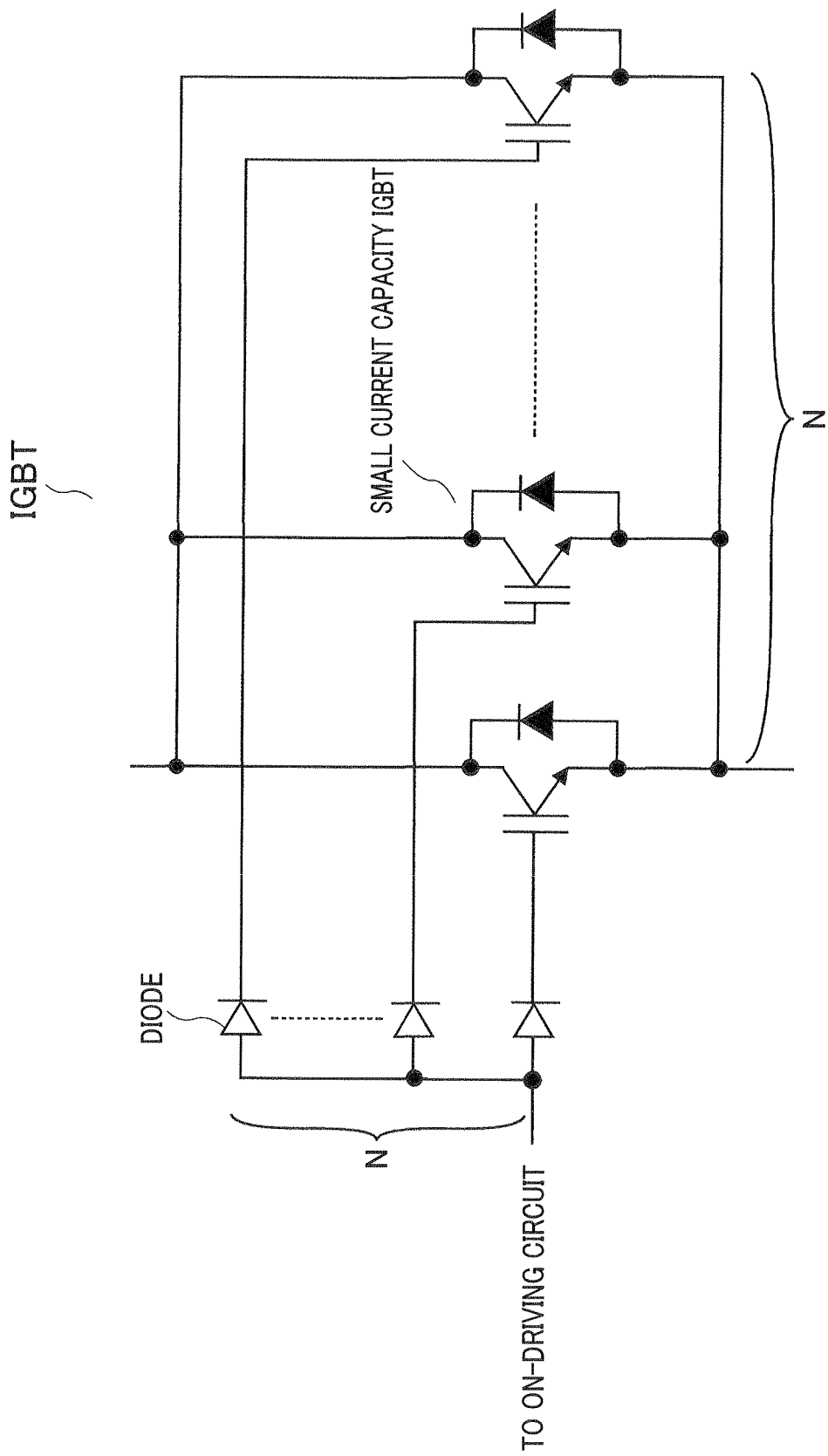
FIG. 4 is a circuit diagram of the periphery of an IGBT according to a second modification of the embodiment.
Figure 5:
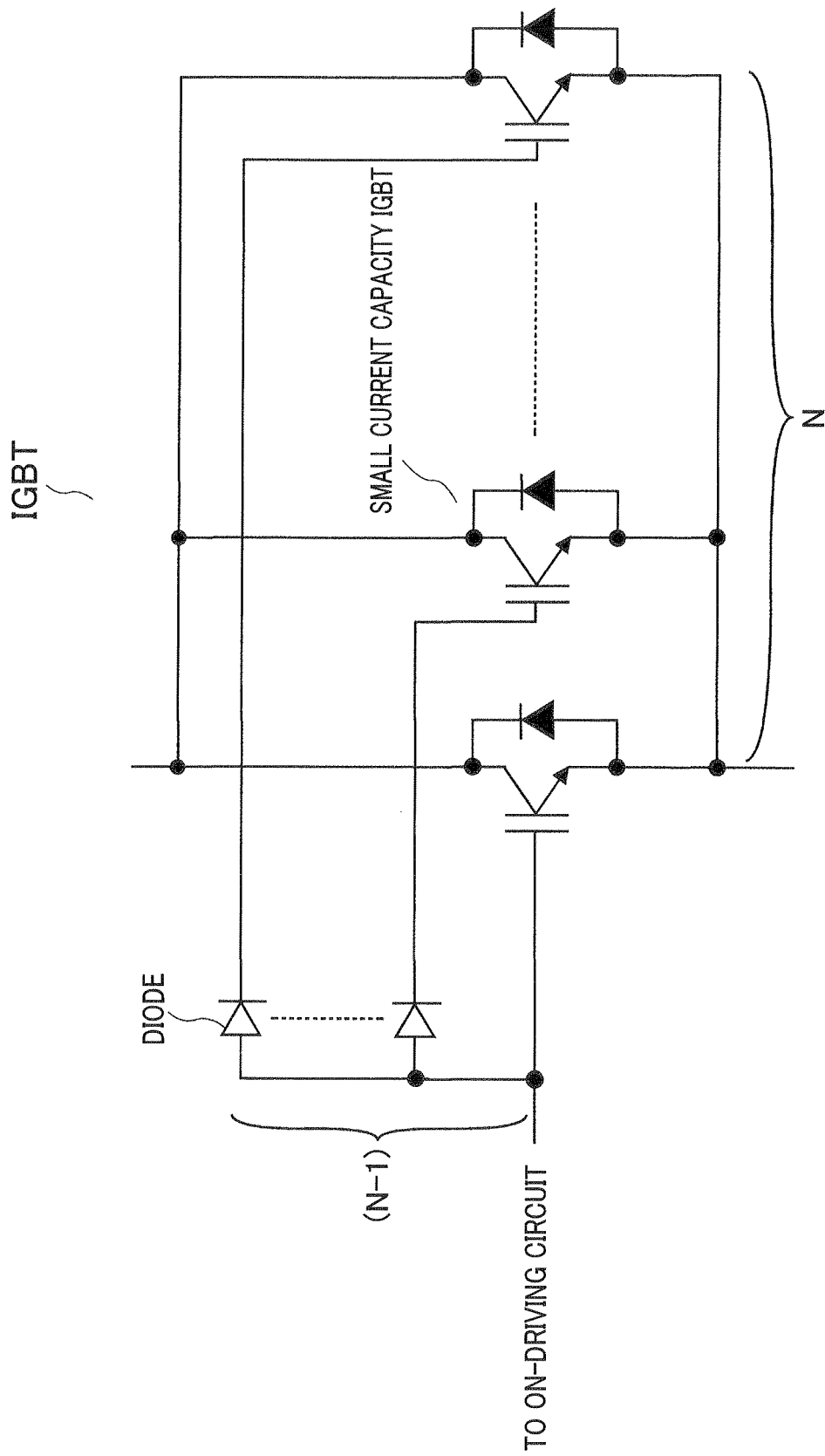
FIG. 5 is a circuit diagram of the periphery of an IGBT according to a third modification of the embodiment.

In the embodiment, in the IGBT 110, the collectors of the small current capacity IGBTs 110a, 110b are commonly connected, and the emitters of the small current capacity IGBTs 110a, 110b are commonly connected. However, other configurations can be employed. As shown in FIG. 4, in the IGBT, collectors of N (≥2) small current capacity IGBTs may be commonly connected, and emitters of the N small current capacity IGBTs may be commonly connected. In this case, diodes may individually be connected between the on-driving circuit and the gates of the small current capacity IGBTs. In addition, as shown in FIG. 5, the diodes may be connected between the on-driving circuit and gates of at least (N−1) small current capacity IGBTs. Even in this case, the flow of the current can be limited in one direction by the diodes. Hence, the amount of current flowing through the closed circuit can be suppressed. Hence, the number of diodes can be decreased, while suppressing resonance as in the case of the embodiment. Furthermore, instead of forming the IGBT by connecting a plurality of small current capacity IGBTs in parallel, the IGBT may be formed of one IGBT. Even in this case, the advantages similar to those of the first embodiment can be obtained.

In addition, in the embodiment, the diodes 122, 123 are respectively integrated with the small current capacity IGBTs 110a, 110b in the same package. However, other configurations can be employed. The diodes 122, 123 may be respectively integrated with the small current capacity IGBTs 110a, 110b so as to be adjacent to each other and to be attached outside. As in the case of the embodiment, temperatures of the small current capacity IGBTs 110a, 110b can be found based on the forward voltage of the diodes 122, 123.

Hereinafter, aspects of the above-described embodiments will be summarized.

As an aspect of an embodiment, an electronic apparatus is provided which includes: a switching element (110) which has a control terminal and is driven by controlling voltage of the control terminal; a driving power supply circuit (120) which supplies voltage required for driving the switching element; an on-driving circuit (121) which is connected to the driving power supply circuit and the control terminal of the switching element and is supplied with voltage from the driving power supply circuit, and which applies a constant current to the control terminal of the switching element to charge the control terminal, thereby turning on the switching element; and at least one diode (122, 123) which is connected between the on-driving circuit and the control terminal of the switching element. The on-driving circuit applies a constant current to the control terminal of the switching element through the diode.

According to this configuration, the diode can limit the flow of the current in one direction. As a result, resonance can be suppressed as in a case where a resistor is connected. In addition, when a constant current flows from the on-driving circuit to the control terminal of the switching terminal, voltage across terminals thereof becomes forward voltage, which is very small. Hence, switching loss can be reduced compared with the case where a resistor is connected.

It will be appreciated that the present invention is not limited to the configurations described above, but any and all modifications, variations or equivalents, which may occur to those who are skilled in the art, should be considered to fall within the scope of the present invention.

What is claimed is:

1. An electronic apparatus, comprising:
a switching element which has a control terminal and is driven by controlling voltage of the control terminal;
a driving power supply circuit which supplies voltage required for driving the switching element;
an on-driving circuit which is connected to the driving power supply circuit and the control terminal of the switching element and is supplied with voltage from the driving power supply circuit, and which applies a constant current to the control terminal of the switching element to charge the control terminal, thereby turning on the switching element;
at least one diode which is connected between the on-driving circuit and the control terminal of the switching element; and
a control circuit which is connected to the diode and controls the driving power supply circuit based on forward voltage of the diode; wherein
the on-driving circuit applies the constant current to the control terminal of the switching element through the diode.

2. An electronic apparatus, comprising:
a switching element which has a control terminal and is driven by controlling voltage of the control terminal;
a driving power supply circuit which supplies voltage required for driving the switching element;
an on-driving circuit which is connected to the driving power supply circuit and the control terminal of the switching element and is supplied with voltage from the driving power supply circuit, and which applies a constant current to the control terminal of the switching element to charge the control terminal, thereby turning on the switching element; and at least one diode which is connected between the on-driving circuit and the control terminal of the switching element, wherein the on-driving circuit applies the constant current to the control terminal of the switching element through the diode;

the switching element is configured by commonly connecting input terminals of a plurality of switching elements having a small current capacity and by commonly connecting output terminals of the switching elements having a small current capacity, the number of the switching elements having a small current capacity being N ($\geq 2$);

the at least one diode is connected between the on-driving circuit and control terminals of the switching elements having a small current capacity, the number of the switching elements having a small current capacity and connected to the at least one diode being at least (N−1); and the number of the switching elements having a small current capacity and connected to the at least one diode and the number of the at least one diode are the same (N), and each of the at least one diode is connected between the on-driving circuit and a corresponding one of the switching elements having a small current capacity and connected to the at least one diode.

* * * * *